United States Patent [19]

Itahana et al.

[11] Patent Number: 4,694,323
[45] Date of Patent: Sep. 15, 1987

[54] APPARATUS FOR VAPOR-COOLING A SEMICONDUCTOR

[75] Inventors: Hiroshi Itahana; Yoshinori Usui, both of Katsuta, Japan

[73] Assignee: Hitachi, Ltd., Tokyo, Japan

[21] Appl. No.: 849,834

[22] Filed: Apr. 9, 1986

[30] Foreign Application Priority Data

Apr. 10, 1985 [JP] Japan .................................. 60-74283

[51] Int. Cl.⁴ .......................................... H01L 25/04
[52] U.S. Cl. ..................................... 357/82; 361/382;
165/80.4; 357/81
[58] Field of Search .................... 357/82, 81; 361/382,
361/385; 165/80.4

[56] References Cited

U.S. PATENT DOCUMENTS 4,028,723   6/1977   Shikano ................................. 357/82

FOREIGN PATENT DOCUMENTS 52-67978    6/1977   Japan .................................... 357/82
53-138677  12/1978   Japan .................................... 357/82
55-41734    3/1980   Japan .
55-68662    5/1980   Japan .

Primary Examiner—Andrew J. James
Assistant Examiner—Mark Prenty
Attorney, Agent, or Firm—Antonelli, Terry & Wands

[57] ABSTRACT

A semiconductor stack is composed of a GTO thyristor, cooling members and wiring conductors which are stacked and tightened together. The semiconductor stack is disposed horizontally in a cooling vessel, and the vessel is filled with a Freon liquid. A condenser is disposed above the cooling vessel and is connected to the cooling vessel by a communication tube, to constitute a cooling apparatus. Each cooling member has a large number of small holes between the GTO thyristor and the wiring conductors between which the cooling member is disposed. The Freon is boiled in the small holes by the heat generated at the GTO thyristor, becomes Freon vapor, and is directed toward the corresponding wiring conductor. Each wiring conductor has a large number of longitudinal slits on the surface thereof which is in contact with the cooling member. The Freon vapor is made to flow upward along these slits by convection currents, thereby increasing the efficiency of the cooling cycle provided by the liquid Freon refrigerant.

9 Claims, 7 Drawing Figures

APPARATUS FOR VAPOR-COOLING A SEMICONDUCTOR

BACKGROUND OF THE INVENTION

1. Field of the Invention

The present invention relates to an improvement to a semiconductor vapor-cooling apparatus which is suitable for use in a chopper or a DC-AC inverter used for controlling the speed of the main motor of a railroad.

2. Description of the Prior Art

Developments in the technology of vapor-cooling a semiconductor element have centered on its application to a chopper or DC-AC inverter which is used in a railroad train, and which requires a semiconductor element of a large capacity.

Known semiconductor vapor-cooling apparatuses include a cooling vessel containing a semiconductor stack and a liquid refrigerant such as Freon 113, as well as a condenser provided above the cooling vessel in such a manner that it communicates with this cooling vessel. The entire cooling vessel and the condenser are hermetically sealed from the atmosphere to constitute a sealed vessel. A typical example of this apparatus is disclosed in the specification of Japanese Patent Laid-Open No. 68662/1980.

One example of the semiconductor stack is disclosed in, for example, the specification of Japanese Patent Laid-Open No. 41734/1980. The semiconductor stack includes a semiconductor element, cooling members (heat-radiating plates) between which the semiconductor element is disposed, and wiring conductors between which the cooling members and semiconductor element are disposed. It is further proposed (in the specification of the above-mentioned Japanese Patent Laid-Open No. 41734/1980) that the surface of the cooling member is made to be porous or it roughened so as to increase the heat dissipation characteristics with respect to a liquid refrigerant, and that a plurality of pins are inserted so as to provide gaps between the cooling members and the wiring conductors.

SUMMARY OF THE INVENTION

In order to cope with the increasing amount of heat generated by a semiconductor element, which has become greater recently as the capacity of semiconductor elements employed have become larger and pulse widths are controlled at higher frequencies, it is an object of the present invention to provide an improved apparatus for vapor-cooling a semiconductor, which is capable of cooling at an increased efficiency.

To this end, the present invention provides an apparatus for vapor-cooling a semiconductor, which includes a semiconductor element, a cooling member for dissipating the heat generated in the element to a liquid refrigerant, and a wiring conductor which is in contact with the cooling member, wherein the apparatus is characterised in that a surface of the conductor which is in contact with the cooling member is formed as an discontinuous contact surface by which the conductor contacts the cooling member discontinuously in the horizontal direction.

In a horizontally-discontinuous contact surface by which the conductor contacts the cooling member discontinuously by, for example, linear paralle slits or grooves, it is desirable that the angle between these slits or grooves and the horizontal is at least 45 degrees.

In a preferred embodiment of the present invention, the cooling member has small holes of about 0.2 mm to 0.5 mm in diameter which pass through the member in the direction which connects the semiconductor element and the conductor, while the conductor includes longitudinal slits of a width of about 1.5 mm to 4 mm and a length which enables the slits to project from the upper and lower ends of the contact area of the surface by which the conductor contacts the cooling member.

DETAILED DESCRIPTION OF THE INVENTION

Embodiments of the present invention will be described hereinunder with reference to the accompanying drawings.

Figure 1:
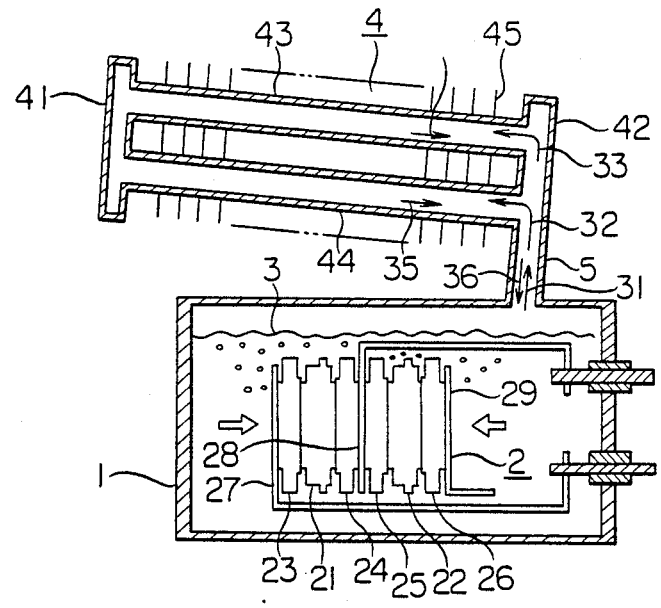
FIG. 1 is a sectional side view of an embodiment of a semiconductor vapor-cooling apparatus according to the present invention.

Referring first to FIG. 1, a cooling vessel 1 contains a semiconductor stack 2 and a liquid refrigerant 3. A condenser 4 is provided above the cooling vessel 1 in such a manner that it communicates with the cooling vessel 1. The condenser 4 includes headers 41 and 42 which are connected by a plurality of condenser tubes 43 and 44. The condenser tubes 43 and 44 have a group of cooling fins 45. The cooling vessel 1 and the condenser 4 are connected by a communication tube 5 which serves as passeges through which refrigerant vapor 31, 32 and 33 flows upward and condensed refrigerant, 34, 35 and 36 returns.

The semiconductor stack 2 contains semiconductor elements 21 and 22, cooling members (heat-radiating plates) 23 to 26 and wiring conductors 27 to 29 which are stacked in such a manner that they are pressed together from the directions shown by the white arrows in FIG. 1.

Figure 2:
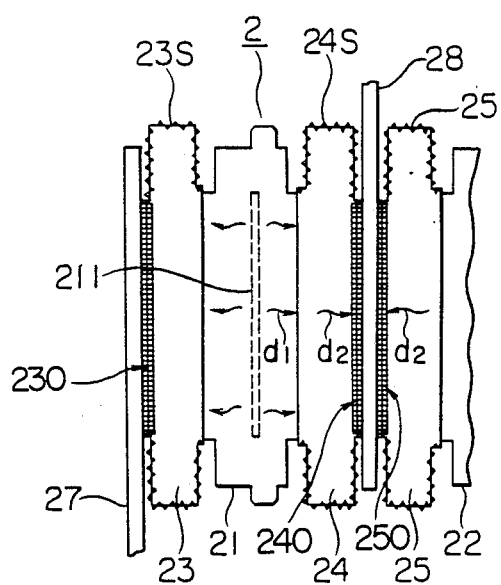
FIG. 2 is an enlarged view of part of the semiconductor stack of the apparatus shown in FIG. 1.
Figure 3:
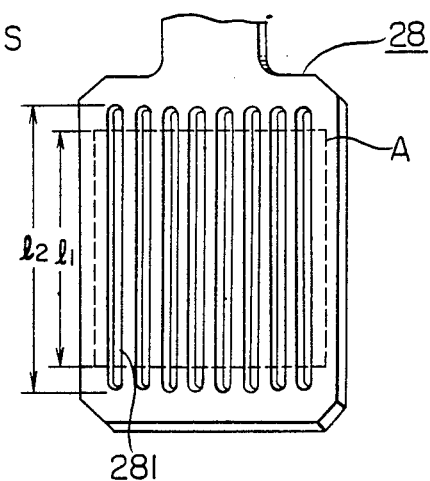
FIG. 3 is a perspective view of the wiring conductor of the apparatus shown in FIG. 1.

FIG. 2 is an enlarged view of part of the semiconductor stack 2 shown in FIG. 1, while FIG. 3 is a perspective view of the wiring conductor 28 of the semiconductor stack 2. The conductor 28 has a large number of longitudinal slits 281 of a length l2 which is larger than the vertical length l1 of an area A of the conductor 28 by which the conductor 28 contacts the cooling member 24 or 25. In other words, the area A of the conductor 28, excluding the part thereof which constitutes part of the group of slits 281, is in contact with the cooling member 24 or 25. The slits 281 of the conductor 28 bring the liquid refrigerant 3 into contact with the surface of the cooling member 24, and the boiling of the refrigerant is accelerated in these slits. The vapor of the refrigerant generated by the boiling thereof flows upward along the slits 281 so as to transfer heat to the condenser 4. In consequence, the heat generated at a heat generating section 211 of the semiconductor element 21 is transferred by the shortest route along arrows d1 and d2, thereby enabling a great reduction in the heat resistance of the cooling members 24 and 25.

To give example of the dimension of the slits: the thickness of the conductor 28 is 4 mm, while the widths of each slit 281 and the contact section between the slits are 1.5 mm and 3 mm, respectively.

In FIG. 2, the cooling members 23, 24 and 25 have porous or roughened surfaces 23S, 24S and 25S, respectively. It is preferable that the contact surface of the cooling member which is contacted to the conductor 28 are also porous or roughened. For this purpose, it is convenient from the cooling point of view to roughen the whole of the surface 230, 240 and 250 of the cooling member which corresponds to the contact surface A in FIG. 3.

Figure 4:
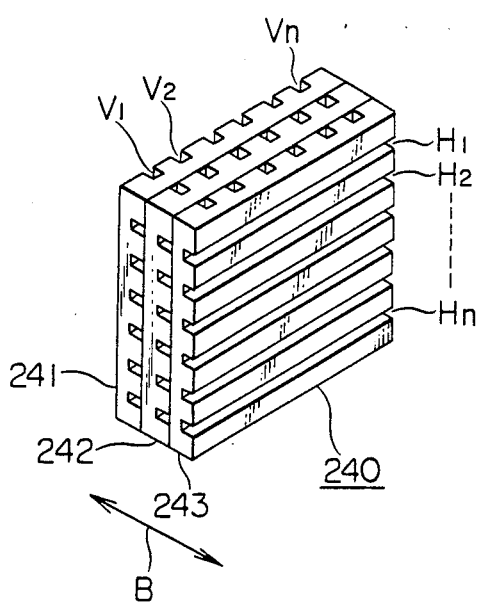
FIG. 4 is a perspective view of another embodiment of the cooling member of the apparatus shown in FIG. 1.

FIG. 4 is a perspective view of another embodiment of the cooling members 23, 24, 25 and 26. In this embodiment, the boiling section 240 of the cooling member 24 is composed of cooling member units 241, 242 and 243 which are stacked together. Both sides of each unit have large numbers of grooves V1, V2 to Vn and H1, H2 to Hn which intersect each other at right angles.

Figure 5:
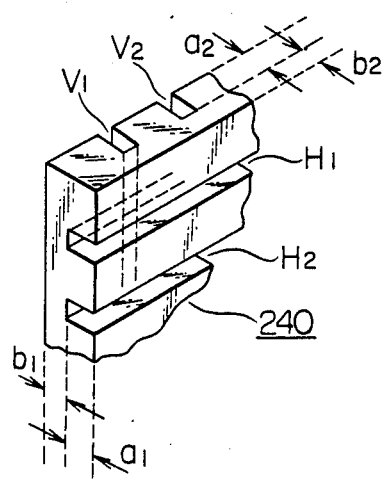
FIG. 5 is an enlarged view of part of the cooling member shown in FIG. 4.

Depths a1 and a2 of these grooves, as shown enlarged in FIG. 5, are larger than remaining thicknesses b1 and b2. In consequence, the cooling member 24 has small holes which pass through the member in the direction shown by the arrows B in FIG. 4 at the intersections between the vertical and horizontal grooves. Assuming that the thickness of the cooling member unit is 1 mm, the width and depth of each groove are 0.25 mm and 0.55 mm, respectively, and the width of the flat sections between the grooves is 0.5 mm, the cooling member 24 has a group of square through holes of a size of 0.25×0.25 mm, which are provided in such a manner that they are distributed over the member between the semiconductor element 2 and the conductor 28 at intervals of 0.5 mm in the longitudinal and lateral directions.

The thus-arranged cooling member is effective from the following points of view.

In order to boil the liquid refrigerant 3 effectively, it is desirable to have holes of a small diameter (about 0.2 mm to 0.5 mm). After the refrigerant is boiled and vaporized, it is necessary to have longitudinal passages of a size 6 times as large as that of the boiling section (between 1.2 mm and 3.0 mm, or above) so as to efficiently circulate the resultant vapor by convection.

The boiling section 240 of the cooling member 24 shown in FIGS. 4 and 5 has a large number of longitudinal and lateral small holes in the vicinity of the semiconductor element 1, and this ensures efficient boiling. The vapor generated by boiling the liquid refrigerant in these small holes, which would not flow upward (be circulated by convection) efficiently through only these small holes, can be moved in the direction of the arrow d2 in FIG. 2 through the large number of small holes which pass through the cooling member 24 in the direction of the arrows B in FIG. 4, and can thus reach by a short route the longitudinal slits 281 in the conductor 28. This vapor flows upward quickly along the slits, thereby achieving extremely efficient cooling.

If the longitudinal slits 281, illustrated in vertical direction in FIG. 3, are provided at an angle of at least 45 degrees to horizontal direction, cooling performance along the vertical direction will generally maintained at high level.

Figure 6:
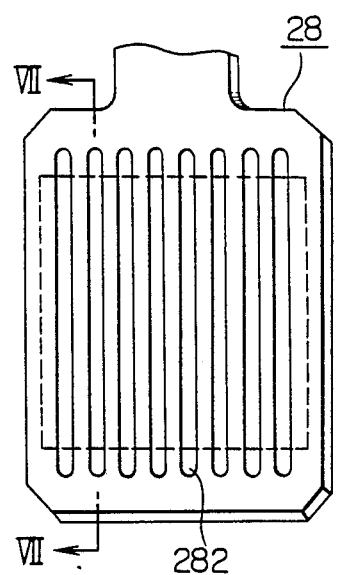
FIG. 6 is a perspective view of another embodiment of the wiring conductor.
Figure 7:
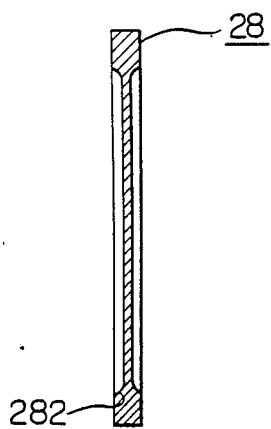
FIG. 7 is a section taken along the line VII—VII of FIG. 6.

FIG. 6 is a perspective view of another embodiment of the wiring conductor 28. The conductor 28 in this embodiment has, in place of the slits 281 of FIG. 3 which pass through the conductor, grooves 282 which are recessed into each side of the conductor.

As is clear from the foregoing description, the present invention makes it possible to provide a semiconductor vapor-cooling apparatus which can efficiently cool a semiconductor element by the boiling of a refrigerant.

What is claimed is:

1. An apparatus for vapor-cooling a semiconductor, comprising a semiconductor stack including an approximately flat board-like semiconductor element, a cooling member and a wiring conductor, a cooling vessel for containing said stack together within a liquid refrigerant to define upper and lower refrigerant regions above and below, respectively, the semiconductor stack to permit cooling of said semiconductor element resulting from the boiling of said liquid refrigerant, wherein said cooling member has a surface facing said wiring conductor and is provided with small apertures opened on the surface thereof facing the wiring conductor, and said conductor is provided with passages for the liquid refrigerant between the upper and the lower refrigerant regions, said passages having a greater width than said small apertures and being vertically disposed in relation to a horizontal defined by an axial disposition of the semiconductor element, the cooling member and the wiring conductor.

2. An apparatus for vapor-cooling a semiconductor according to claim 1, wherein said passages have a width at least six times more than that of said small aperatures.

3. An apparatus for vapor-cooling a semiconductor according to claim 1, wherein said passages constitute a large number of parallel slits on a surface of said conductor which faces said cooling member, said slits being provided at an angle of at least 45 degrees to the horizontal.

4. An apparatus for vapor-cooling a semiconductor according to claim 1, wherein said passages constitute a large number of long parallel grooves, said grooves being provided at an angles of at least 45 degrees to the horizontal.

5. An apparatus for vapor-cooling a semiconductor according to claim 1, wherein said cooling member has a large number of small longitudinal and lateral holes.

6. An apparatus for vapor-cooling a semiconductor, comprising a semiconductor stack including an approximately flat board-like semiconductor element, a cooling member and a wiring conductor arranged in side-by-side abutting relation to one another to define a horizontal direction, and a cooling vessel for containing said stack within a liquid refrigerant to define upper and lower refrigerant regions above and below, respectively, the semiconductor stack, said semiconductor element being cooled by virtue of boiling of said liquid refrigerant, wherein said cooling member comprises a laminated body composed of a plurality of unitary cooling members, each unitary cooling member being provided on opposed sides thereof with a large number of parallel grooves, the grooves on one side of a unitary cooling member extending perpendicular to the grooves on the other side of that unitary cooling member, said grooves on opposed sides each having such a depth as to establish communication between intersecting grooves, and thereby forming in said laminated body a large number of small internal holes which extend in the horizontal direction and are opened on a side surface of said laminated body facing the conductor, and said conductor being provided with passages for the liquid refrigerant between the upper and the lower refrigerant regions which communicate with said small holes, said passages having a width greater than that of said small holes.

7. An apparatus for vapor-cooling a semiconductor according to claim 6, wherein said passages are more than six times greater in width than that of said small holes.

8. An apparatus for vapor-cooling a semiconductor according to claim 5, wherein said vertical passages are more than six times greater in width than that of said small holes.

9. An apparatus for vapor-cooling a semiconductor according to 6, wherein said passages constitute a large number of long parallel grooves, said grooves being provided at an angle of at least 45 degrees to the horizontal.

* * * * *